(12) United States Patent
Sakaguchi et al.

(10) Patent No.: US 7,164,183 B2
(45) Date of Patent: Jan. 16, 2007

(54) SEMICONDUCTOR SUBSTRATE, SEMICONDUCTOR DEVICE, AND METHOD OF MANUFACTURING THE SAME

(75) Inventors: Kiyofumi Sakaguchi, Kanagawa (JP); Nobuhiko Sato, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 230 days.

(21) Appl. No.: 10/857,881

(22) Filed: Jun. 2, 2004

(65) Prior Publication Data

US 2004/0259315 A1 Dec. 23, 2004

(30) Foreign Application Priority Data

Jun. 9, 2003 (JP) ............................. 2003-164085
Mar. 3, 2004 (JP) ............................. 2004-059449

(51) Int. Cl.
*H01L 29/00* (2006.01)

(52) U.S. Cl. ...................... 257/499; 257/500; 257/478; 257/497; 257/E29.193; 438/479; 438/500; 438/478

(58) Field of Classification Search ................ 438/500, 438/459, 455, 458, 478, 479, 497; 257/347, 257/359, 352, 499, 524, 478, 497
See application file for complete search history.

(56) References Cited

U.S. PATENT DOCUMENTS

| | | | |
|---|---|---|---|
| 4,982,263 A * | 1/1991 | Spratt et al. ................. 257/524 |
| 5,685,946 A * | 11/1997 | Fathauer et al. ............ 438/500 |
| 5,970,361 A | 10/1999 | Kumomi et al. ............. 438/409 |
| 6,106,613 A | 8/2000 | Sato et al. .................... 117/54 |
| 6,143,628 A | 11/2000 | Sato et al. ................... 438/455 |
| 6,143,629 A | 11/2000 | Sato ............................ 438/455 |
| 6,156,624 A | 12/2000 | Yamagata et al. .......... 438/459 |
| 6,171,982 B1 | 1/2001 | Sato ............................ 438/795 |
| 6,190,937 B1 | 2/2001 | Nakagawa et al. ........... 438/67 |
| 6,211,038 B1 | 4/2001 | Nakagawa et al. ......... 438/409 |
| 6,221,738 B1 | 4/2001 | Sakaguchi et al. .......... 438/455 |
| 6,258,698 B1 | 7/2001 | Iwasaki et al. ............. 438/455 |
| 6,306,729 B1 | 10/2001 | Sakaguchi et al. .......... 438/458 |
| 6,331,208 B1 | 12/2001 | Nishida et al. ............... 117/89 |
| 6,335,269 B1 | 1/2002 | Sato ............................ 438/509 |
| 6,342,433 B1 | 1/2002 | Ohmi et al. ................. 438/455 |
| 6,375,738 B1 | 4/2002 | Sato ............................ 117/89 |
| 6,382,292 B1 | 5/2002 | Ohmi et al. ................. 156/584 |
| 6,391,743 B1 | 5/2002 | Iwane et al. ................ 438/458 |
| 6,407,367 B1 | 6/2002 | Ito et al. ..................... 219/390 |
| 6,413,874 B1 | 7/2002 | Sato ............................ 438/714 |
| 6,429,095 B1 | 8/2002 | Sakaguchi et al. .......... 438/458 |

(Continued)

FOREIGN PATENT DOCUMENTS

JP 2000-286418 10/2000

OTHER PUBLICATIONS

D. Bellet, "Elastic properties of porous silicon", May 1997, L. Canham, ed., Properties of Porous Silicon, INSPEC, The Institution of Electrical Engineers, pp. 127-131.

(Continued)

*Primary Examiner*—Asok K. Sarkar
*Assistant Examiner*—Victor V. Yevsikov
(74) *Attorney, Agent, or Firm*—Fitzpatrick, Cella, Harper & Scinto

(57) ABSTRACT

A semiconductor device includes a porous layer, a structure which is formed on the porous layer and has a semiconductor region whose height of the sectional shape is larger than the width, and a strain inducing region which strains the structure by applying stress to it.

11 Claims, 12 Drawing Sheets

U.S. PATENT DOCUMENTS

| | | | |
|---|---|---|---|
| 6,452,091 B1 | 9/2002 | Nakagawa et al. | 136/261 |
| 6,475,323 B1 | 11/2002 | Ohmi et al. | 156/239 |
| 6,506,665 B1 | 1/2003 | Sato | 438/458 |
| 6,566,235 B1 | 5/2003 | Nishida et al. | 438/458 |
| 6,569,748 B1 | 5/2003 | Sakaguchi et al. | 438/455 |
| 6,593,211 B1 | 7/2003 | Sato | 438/455 |
| 6,597,039 B1 | 7/2003 | Ohmi et al. | 257/347 |
| 6,613,678 B1 | 9/2003 | Sakaguchi et al. | 438/695 |
| 6,639,327 B1 | 10/2003 | Momoi et al. | 257/913 |
| 6,664,169 B1 | 12/2003 | Iwasaki et al. | 438/409 |
| 6,677,183 B1 | 1/2004 | Sakaguchi et al. | 438/113 |
| 2002/0100941 A1 | 8/2002 | Yonehara et al. | 257/359 |
| 2002/0102758 A1 | 8/2002 | Yonehara et al. | 438/30 |
| 2002/0146892 A1 | 10/2002 | Notsu et al. | 438/455 |
| 2004/0055894 A1 | 3/2004 | Iwasaki et al. | 205/157 |
| 2004/0082149 A1 | 4/2004 | Sakaguchi et al. | 438/458 |

OTHER PUBLICATIONS

"Two High-Performance Transistor Techniques Developed in Front Line of Semiconductor Field," http://www.mitsubishielectric.co.jp/news/2002/1217-b.html, Dec. 17, 2002.

D. Hisamoto, et al. "A Folded-Channel MOSFET for Deep-Sub-Tenth Micron Era," IEDM Tech. Dig., 1998, pp. 1032-1034.

* cited by examiner

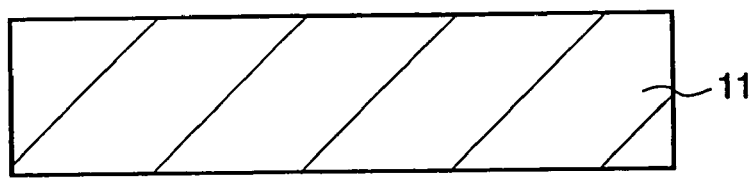
F I G. 2A
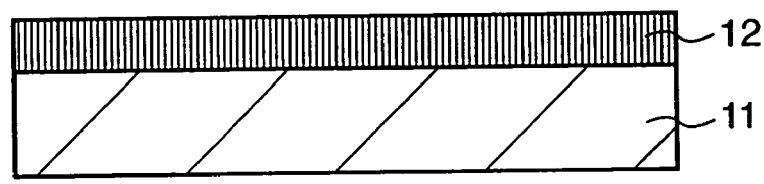
F I G. 2B
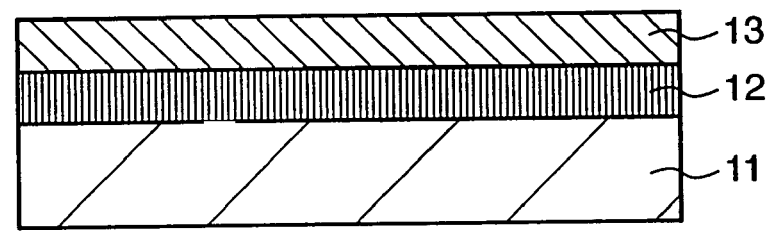
F I G. 2C
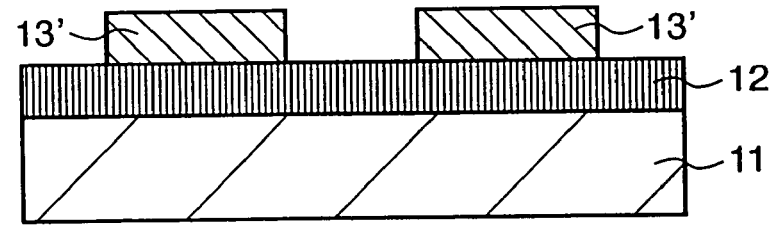
F I G. 2D
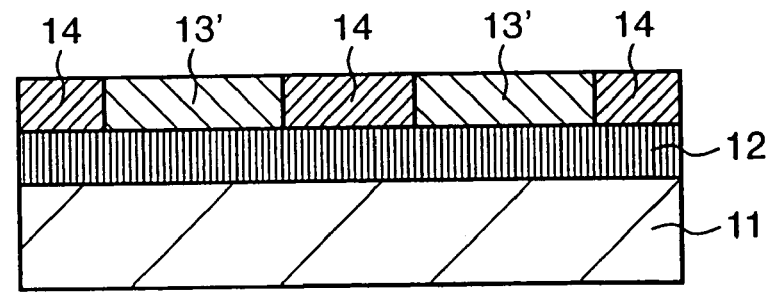
F I G. 2E

SEMICONDUCTOR SUBSTRATE, SEMICONDUCTOR DEVICE, AND METHOD OF MANUFACTURING THE SAME

FIELD OF THE INVENTION

The present invention relates to a semiconductor substrate, semiconductor device, and method of manufacturing the same.

BACKGROUND OF THE INVENTION

Conventionally, hetero epitaxial growth is known as a method of epitaxially growing, on a single-crystal substrate, a material different from it. In hetero epitaxial growth, an epitaxial layer having a strained crystal lattice can be formed depending on the material and conditions of crystal growth. In an epitaxial layer having a strained crystal lattice, the atomic interval in the epitaxial layer increases due to tensile stress. Accordingly, the effective mass of carriers in the epitaxial layer decreases, and the carrier mobility can be increased.

As a technique using this fact, Japanese Patent Laid-Open No. 2000-286418 discloses a technique for increasing the carrier mobility by using a silicon layer (to be referred to as a "strained silicon layer" hereinafter) strained by an SiGe layer. In the strained Si technology, an Si layer is formed on an SiGe layer to strain the semiconductor layer to make the lattice constant of the semiconductor layer larger than that of the unstrained Si, thereby increasing the carrier mobility in a channel. When silicon is epitaxially grown on an SiGe layer, it grows complying with SiGe having a lattice constant larger than that of silicon (the lattice constant difference between Si and Ge is about 4%). Hence, strain of several % occurs (the strain amount changes depending on the amount of Ge contained in the SiGe layer).

On the Internet, an article titled "Two high-performance transistor techniques developed in front line of semiconductor field" is disclosed at http://www.mitsubishielectric.co.jp/news/2002/1217-b.ht ml with a dateline of Dec. 17, 2002. In this technique, tensile stress is applied to a silicon layer from its upper side to strain the crystal lattice of the silicon layer. For example, tensile stress is applied to a channel region from the side of a gate electrode formed above the channel region, thereby increasing the carrier mobility in the channel region.

However, in the technique of Japanese Patent Laid-Open No. 2000-286418, since the SiGe layer contains defects, it is difficult to form a strained silicon layer having high crystallinity. In the article disclosed on the Internet, after an unstrained silicon layer is formed, strain is introduced by a device structure formed on the silicon layer. In this case, the structure under the strained silicon layer is made of a material matched before the silicon layer is strained. For this reason, when strain is to be applied from the upper side of the silicon layer, a force which prevents the strain is generated in the layer under the silicon layer. Generally, when biaxial stress is applied to a silicon layer to strain it, a strain amount is generated in the plane of silicon in accordance with $$\epsilon = (1-\nu) \cdot \sigma / E \qquad \text{(Equation 1)}$$

where $\epsilon$ is the strain amount (no unit) in the plane of silicon, $\nu$ is the Poisson's ratio (no unit) of silicon crystal, $\sigma$ is biaxial stress [GPa] applied in the plane of silicon, and E is the Young's modulus [GPa] of silicon crystal. Normally, to obtain 1% to 2% as the strain amount $\epsilon$ of silicon on SiGe when E=162 GPa, and $\nu$=0.26, stress $\sigma$ of 2.2 to 4.4 [GPa] is necessary. Hence, in a general Si-LSI (Large-Scale Integration) structure, not only the surface silicon layer but also an underlying portion must be strained. To do this, if stress is applied from the upper or side surface of the silicon layer, larger stress than the above value needs to be applied.

On the other hand, in manufacturing semiconductor devices, reduction of the element size progresses to implement high integration degree and high operation speed of semiconductor devices. However, along with the reduction of the element size, the carrier mobility decreases, and the leakage current increases. It is accordingly pointed out that the micropatterning technology should reach its physical limit in the future.

To cope with this problem, Japanese Patent Laid-Open No. 2000-286418 discloses a strained Si technology for increasing the carrier mobility of a transistor without depending on micropatterning. However, as described above, since an SiGe layer generally contains defects, it is difficult to form a strained silicon layer having high crystallinity.

"A folded-channel MOSFET for deep-sub-tenth micron era", in IEDM Tech. Dig., 1998, pp. 1032–1034 discloses, as an epoch-making device structure next to the strained Si structure, a Fin FET developed by a group of Professor C. Hu et al in the University of California, Berkeley. In a conventional planar FET, the channel is controlled from the upper side by a gate electrode formed on silicon. In the Fin FET, a gate electrode is formed to sandwich a channel called a "Fin" on silicon so that the channel is controlled from both sides. With this structure, the increase in leakage current, which poses a problem in the conventional planar FET, can effectively be suppressed, and a finer device structure can be formed.

A Fin FET can easily be manufactured by using the current semiconductor device process. In addition, it is supposed that elements 400 times that in the prior art can be integrated on the chip. Hence, the Fin is regarded as a promising device structure of next generation.

In the Fin FET however, the channel is formed on a non-porous layer. If strain is to be applied from the upper side of the channel, a force which counteracts the strain is generated in the layer under the channel. Hence, the channel can hardly efficiently be strained.

SUMMARY OF THE INVENTION

The present invention has been made in consideration of the above situation, and has as its object to efficiently strain a semiconductor layer or semiconductor region.

According to the first aspect of the present invention, there is provided a semiconductor substrate characterized by comprising a semiconductor layer, a porous layer which supports the semiconductor layer, and a strain inducing region which strains the semiconductor layer by applying stress to the semiconductor layer.

According to the second aspect of the present invention, there is provided a semiconductor substrate characterized in that a semiconductor device is formed on the semiconductor layer.

According to the third aspect of the present invention, there is provided a semiconductor substrate manufacturing method characterized by comprising steps of forming a porous layer on a substrate, forming a semiconductor layer on the porous layer, and forming a strain inducing region which strains the semiconductor layer by applying stress to the semiconductor layer.

According to the fourth aspect of the present invention, there is provided a semiconductor device manufacturing method characterized by comprising steps of preparing a semiconductor substrate manufactured by applying the above manufacturing method, and forming a semiconductor device on the semiconductor substrate.

According to the fifth aspect of the present invention, there is provided a semiconductor device comprising a porous layer, a structure which is formed on the porous layer and has a semiconductor region whose height of a sectional shape is larger than a width of the sectional shape, and a strain inducing region which strains the structure by applying stress to the structure.

According to the sixth aspect of the present invention, there is provided a transistor comprising the above semiconductor device, a source which is formed at one end of a semiconductor region, and a drain which is formed at other end of the semiconductor region.

According to the seventh aspect of the present invention, there is provided a semiconductor device manufacturing method comprising steps of forming a porous layer on a substrate, forming a semiconductor layer on the porous layer, etching the semiconductor layer to form a semiconductor region whose height of a sectional shape is larger than a width of the sectional shape, and forming a strain inducing region which strains the semiconductor region by applying stress to the semiconductor region.

According to the eighth aspect of the present invention, there is provided a semiconductor device manufacturing method comprising steps of forming a porous layer on a substrate, forming a semiconductor layer on the porous layer, etching the porous layer and the semiconductor layer to form a semiconductor region whose height of a sectional shape is larger than a width of the sectional shape, and forming a strain inducing region which strains a porous region and the semiconductor region by applying stress to the porous region and the semiconductor region.

According to the ninth aspect of the present invention, there is provided a semiconductor device manufacturing method comprising steps of partially forming a porous layer on a substrate, forming a semiconductor layer on the partially formed porous layer, etching the semiconductor layer to form, on the partially formed porous layer, a semiconductor region whose height of a sectional shape is larger than a width of the sectional shape, and forming a strain inducing region which strains the semiconductor region by applying stress to the semiconductor region.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 2A to 2E are sectional views for explaining a substrate manufacturing method according to the preferred second embodiment of the present invention;

DETAILED DESCRIPTION OF THE PREFERRED EMBODIMENTS

The preferred embodiments of the present invention will be described below with reference to the accompanying drawings.

(First Embodiment)

FIGS. 1A to 1E are sectional views for explaining a substrate manufacturing method according to the preferred first embodiment of the present invention.

Figure 1A:
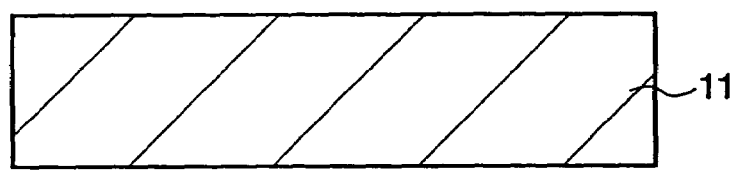
FIGS. 1A to 1E are sectional views for explaining a substrate manufacturing method according to the preferred first embodiment of the present invention.

In the step shown in FIG. 1A, a substrate 11 is prepared. As the substrate 11, for example, silicon is preferable. However, any other material may be employed.

Figure 1B:
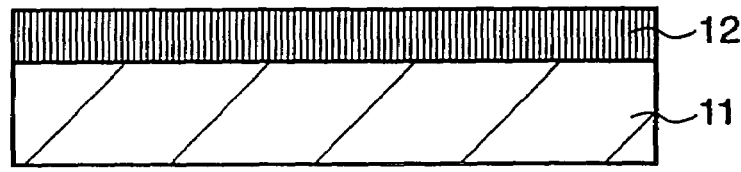

In the step shown in FIG. 1B, a porous layer 12 is formed on the surface of the substrate 11. The Young's modulus of the porous layer 12 is lower than that of a semiconductor layer 13 to be formed in the step shown in FIG. 1C. As the material of the porous layer 12, porous silicon prepared by porosifying silicon is preferably employed. A porous silicon layer can be formed by anodizing the surface of the silicon substrate. Anodizing can be executed by arranging an anode and a cathode in an electrolytic solution containing hydrofluoric acid, placing the substrate between the electrodes, and supplying a current between the electrodes.

The porous silicon layer may include a single layer having an almost uniform porosity or two or more layers having different porosities. The Young's modulus of the porous silicon layer can be changed to at least about 1 GPa to about 83 GPa by changing the porosity (e.g., D. Bellet, "Properties of Porous Silicon", edited by L Canham, INSPEC, The Institution of Electrical Engineers, pp. 127–131).

Figure 5:
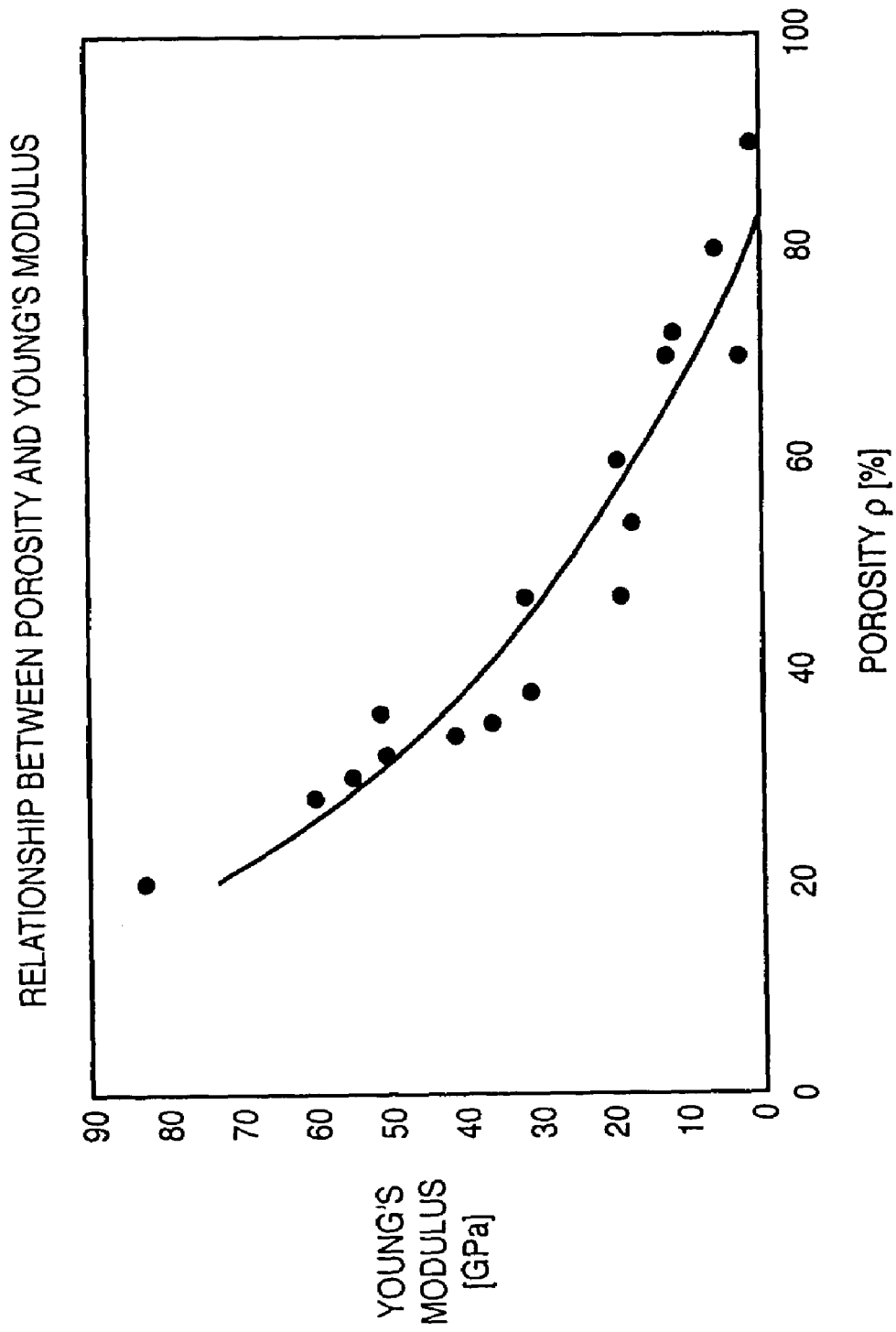
FIG. 5 is a graph showing the relationship between the porosity and the Young's modulus.

FIG. 5 is a graph showing the relationship between a porosity σ and the Young's modulus E of porous silicon on the basis of data disclosed in the paper by D. Bellet. As shown in FIG. 5, the higher the porosity of porous silicon becomes, the lower the Young's modulus becomes. When anodizing is used, the porosity of porous silicon can be controlled by the concentration of the solution, the current density, and the resistivity of the silicon substrate. Hence, porous silicon having a desired Young's modulus can be formed.

In the present invention, the method of forming a porous layer is not limited to anodizing. For example, a method of implanting hydrogen ions or helium ions in the substrate can also be employed.

Figure 1C:
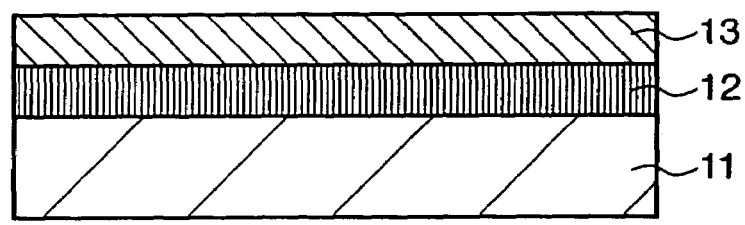

In the step shown in FIG. 1C, the semiconductor layer 13 is formed on the porous layer 12 by epitaxial growth. By epitaxial growth, a high-quality semiconductor layer can be formed.

Figure 1D:
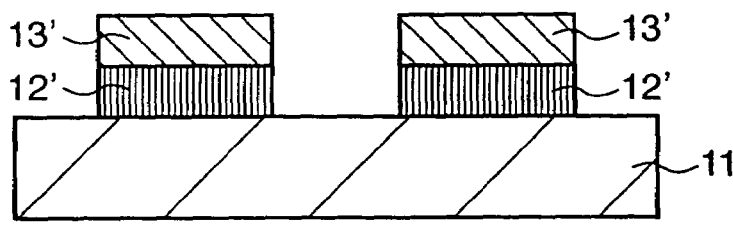

In the step shown in FIG. 1D, after a resist is applied onto the semiconductor layer 13, the porous layer 12 and semiconductor layer 13 are patterned by general lithography to form opening portions. With this process, a plurality of porous layers 12' and semiconductor layers 13' each having an island shape are formed on the substrate 11. The width of each opening portion is not particularly limited, though it is preferably 1 μm or more.

Figure 1E:
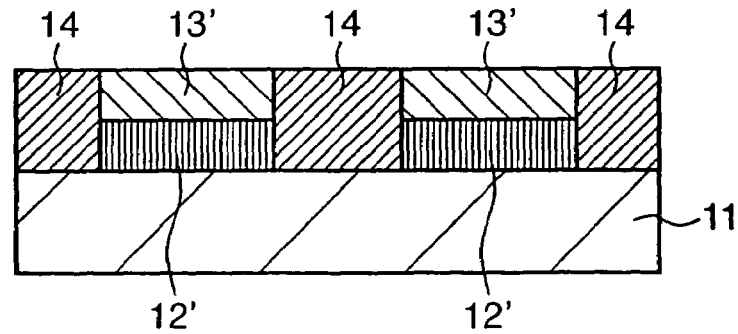

In the step shown in FIG. 1E, a strain inducing region 14 which applies stress to the semiconductor layer 13' is formed on the substrate 11 exposed to each opening portion formed in the step shown in FIG. 1D. The strain inducing region 14 acts to pull the porous layer 12' and semiconductor layer 13' in a direction almost parallel to their surfaces so that stress acts on the second semiconductor layer 13' to stretch it in an almost horizontal direction. In the semiconductor layer 13' to which a tensile force acts in the in-plane direction by the strain inducing region 14, the crystal lattice is strained, and the mobility of carriers that move in the semiconductor layer 13' increases. As the strain inducing region 14, silicon oxide or SiN using, e.g., TEOS (Tetra Ethyl Ortho Silicate) as a raw material can be employed.

With the above method, a substrate having the porous layer 12' formed on the substrate 11, the semiconductor layer 13' formed on the porous layer 12', and the strain inducing region 14 which applies stress to the semiconductor layer 13' to increase the carrier mobility in the semiconductor layer 13' can be manufactured.

To form CVD (Chemical Vapor Deposition) oxide silicon, TEOS, TEOS+$O_2$, TEOS+$O_3$, $SiH_4$+$O_2$, $SiH_4$+$N_2O$, $SiH_2Cl_2$+$N_2O$, or the like is used. CVD methods include thermal CVD and plasma CVD.

To form silicon nitride, thermal CVD and plasma CVD can be used. Examples of a raw material containing Si are $SiCl_2$, SiH, and $SiH_2Cl_2$. Examples of a raw material containing N are $NH_3$, $N_2H_4$, and $N_2$.

The porous layer 12' having a lower Young's modulus than that of the semiconductor layer 13' is formed on the lower side. For this reason, most of the tensile force applied from the strain inducing region 14 to the semiconductor layer 13' acts on the semiconductor layer 13' so that the force that pulls the semiconductor layer 13' can be small. When the porous layer 12' is arranged under the semiconductor layer 13' to efficiently convert the tensile force into in-plane strain, large strain can be generated by smaller stress.

In addition, when the island-shaped semiconductor layers 13' are formed, they can independently be strained. If the semiconductor layer 13 is formed uniformly on the porous layer 12 and strained, the entire strain amount can be enormous. For example, if SiGe is completely relaxed, the strained silicon layer on SiGe is strained by about 1% in plane. In a wafer having a diameter of 300 mm, the total strain amount is 3 mm. When the layer is strained from an unstrained state, a silicon layer having a diameter larger by 3 mm is formed. Actually, the entire silicon layer cannot be strained up to such an amount. According to the first embodiment, the semiconductor layers 13' each having an island shape are formed on the substrate 11. Accordingly, a 1-μm opening portion is formed in correspondence with, e.g., a 10-μm square semiconductor layer 13'. Each island-shaped semiconductor layer 13' has a size of 10.1 mm, and each opening portion between the semiconductor layers 13' has a size of 0.9 mm so that the island-shaped semiconductor layers 13' can individually be strained.

In forming strained Si on SiGe, it is already strained at the time of deposition (epitaxial growth). Hence, the actual size never increases. However, when an unstrained layer is strained later, the above-described problem is posed.

(Second Embodiment)

A substrate manufacturing method according to the preferred second embodiment of the present invention will be described next. In the substrate manufacturing method according to this embodiment, some steps in the substrate manufacturing method according to the first embodiment are changed. FIGS. 2A to 2E are sectional views for explaining the substrate manufacturing method according to the second embodiment. The steps shown in FIGS. 2A to 2C are the same as those shown in FIGS. 1A to 1C.

In the step shown in FIG. 2D, a semiconductor layer 13 is etched to form opening portions. In the step shown in FIG. 2E, a strain inducing region 14 is formed on a porous layer 12 exposed to each opening portion. With the above structure, a semiconductor layer 13' formed on the porous layer 12 can efficiently be strained.

(Third Embodiment)

Figure 3A:
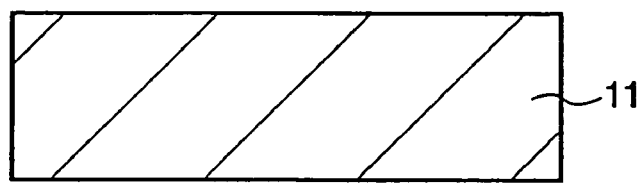
FIGS. 3A to 3E are sectional views for explaining a substrate manufacturing method according to the preferred third embodiment of the present invention.

A substrate manufacturing method according to the preferred third embodiment of the present invention will be described next. In the substrate manufacturing method according to this embodiment, some steps in the substrate manufacturing method according to the first embodiment are changed. FIGS. 3A to 3E are sectional views for explaining the substrate manufacturing method according to the third embodiment. The steps shown in FIGS. 3A and 3C are the same as those shown in FIGS. 1A and 1C.

Figure 3B:
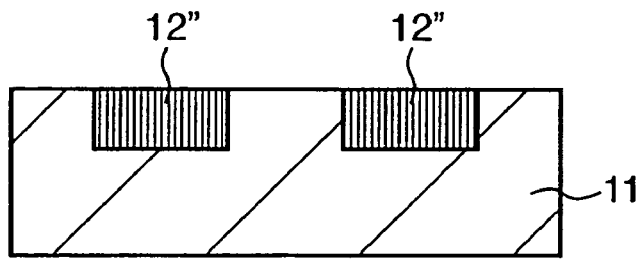
Figure 3C:
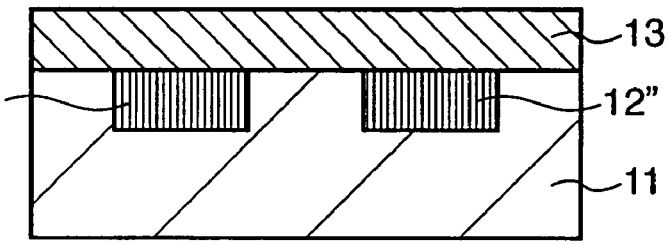
Figure 3D:
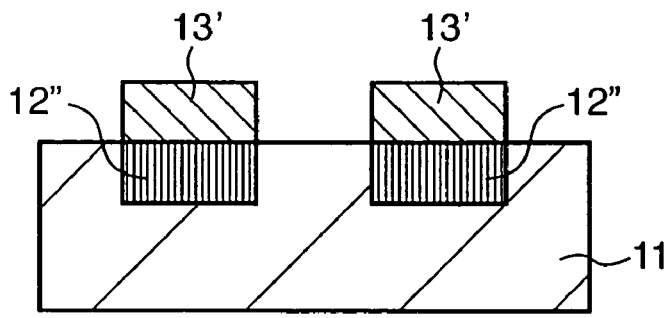
Figure 3E:
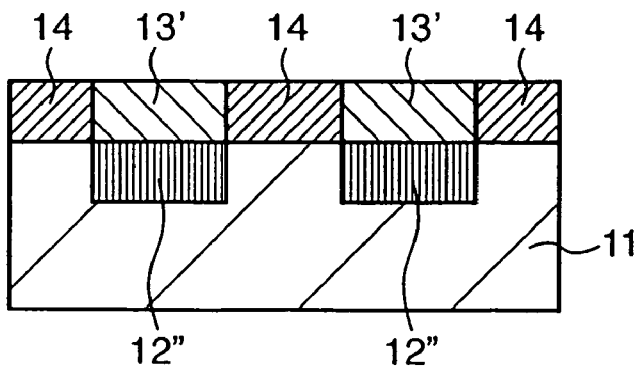

In the step shown in FIG. 3B, porous layers are partially formed in a substrate 11. When anodizing is employed as a method of forming the porous layer, for example, a protective film (e.g., a nitride film or HF-resistant mask) which protects the substrate from the chemical solution (e.g., hydrofluoric acid) used in anodizing is formed on the substrate 11. After that, the substrate 11 is anodized to form partial porous layers 12' shown in FIG. 3B. In the step shown in FIG. 3D, a semiconductor layer 13 is etched to form opening portions. In the step shown in FIG. 3E, a strain inducing region 14 is formed on the substrate 11 exposed to each opening portion. With the above structure, a semiconductor layer 13' formed on the porous layer 12 can efficiently be strained.

[First Application Example of Semiconductor Substrate]

In this application example, a method of manufacturing a semiconductor device using a semiconductor substrate which can be manufactured by using the substrate manufacturing method according to one of the preferred first to third embodiments of the present invention will be described.

Figure 4A:
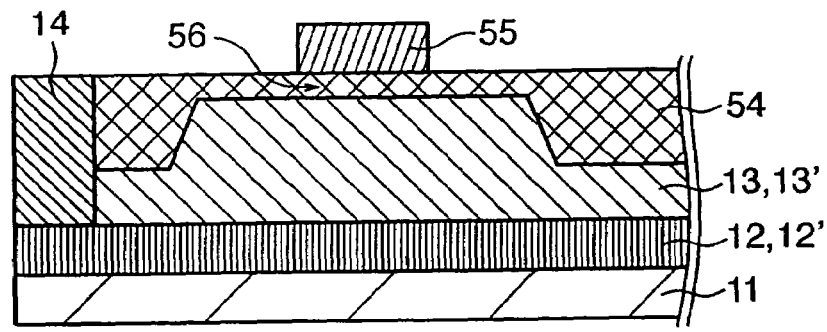
FIGS. 4A to 4D are sectional views for explaining the first application example of a semiconductor substrate according to a preferred embodiment of the present invention.

FIGS. 4A to 4D show a structure near a semiconductor layer 13' and strain inducing region 14 of a substrate which is manufactured by the steps according to the second embodiment of the preferred first to third embodiments of the present invention. First, an element isolation region 54 and a gate insulating film 56 are formed on the surfaces of the semiconductor layer 13 or 13' (FIG. 4A). As the material of the gate insulating film 56, for example, silicon oxide, silicon nitride, silicon oxynitride, aluminum oxide, tantalum oxide, hafnium oxide, titanium oxide, scandium oxide, yttrium oxide, gadolinium oxide, lanthanum oxide, zirconium oxide, or mixed glass thereof is preferably used. The gate insulating film 56 can be formed by, e.g., oxidizing the surface of the semiconductor layer 13 or 13' or depositing an appropriate substance on the surface of the semiconductor layer 13 or 13' by CVD or PVD.

A gate electrode 55 is formed on the gate insulating film 56. The gate electrode 55 can be formed from, e.g., polysilicon doped with a p- or n-type impurity, a metal such as tungsten, molybdenum, titanium, tantalum, aluminum, or copper, an alloy containing at least one of them, or a metal silicide such as molybdenum silicide, tungsten silicide, or cobalt silicide, or a metal nitride such as titanium nitride, tungsten nitride, or tantalum nitride. The gate insulating film 56 may be formed by stacking a plurality of layers made of different materials, like, e.g., a polycide gate. The gate electrode 55 may be formed by, e.g., a method called salicidation (self-aligned formation of silicide), a method called a damascene gate process, or any other method. With the above step, the structure shown in FIG. 4A is obtained.

Figure 4B:
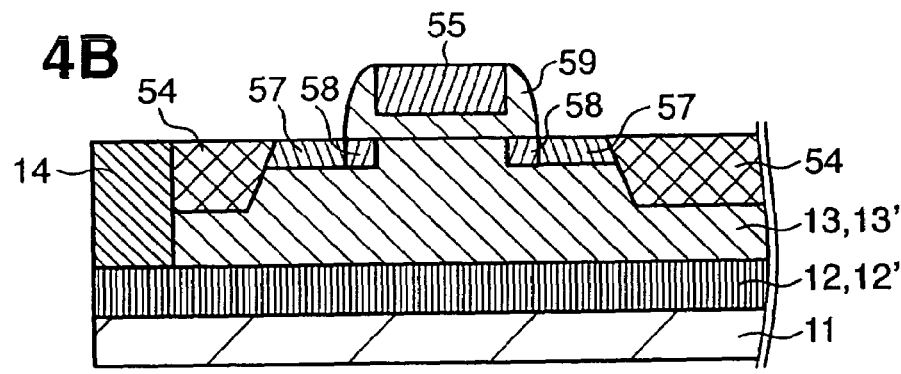

Next, an n-type impurity such as phosphorus, arsenic, or antimony or a p-type impurity such as boron is doped into the semiconductor layer 13 or 13' to form relatively lightly doped source and drain regions 58 (FIG. 4B). The impurity can be doped by, e.g., ion implantation and annealing.

An insulating film which covers the gate electrode 55 is formed and etched back to form a sidewall 59 on the side portion of the gate electrode 55.

An impurity having the same conductivity type as that of the above impurity is doped into the semiconductor layer 13 or 13' again to form relatively heavily doped source and drain regions 57. With the above step, the structure shown in FIG. 4B is obtained.

Figure 4C:
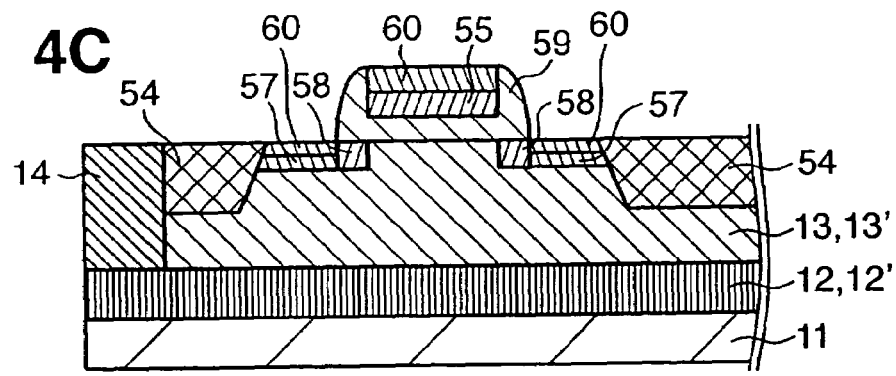

A metal silicide layer 60 is formed on the upper surface of the gate electrode 55 and the upper surfaces of the source and drain regions 57 (FIG. 4C). As the material of the metal silicide layer 60, for example, nickel silicide, titanium silicide, cobalt silicide, molybdenum silicide, or tungsten silicide is preferably used. These silicides can be formed by depositing a metal to cover the upper surface of the gate electrode 55 and the upper surfaces of the source and drain regions 57, executing annealing to make the metal react with silicon on the lower side, and removing unreacted portions of the metal by using an etchant such as sulfuric acid. The surface of the suicide layer may be nitrided as needed. With the above step, the structure shown in FIG. 4C is obtained.

Figure 4D:
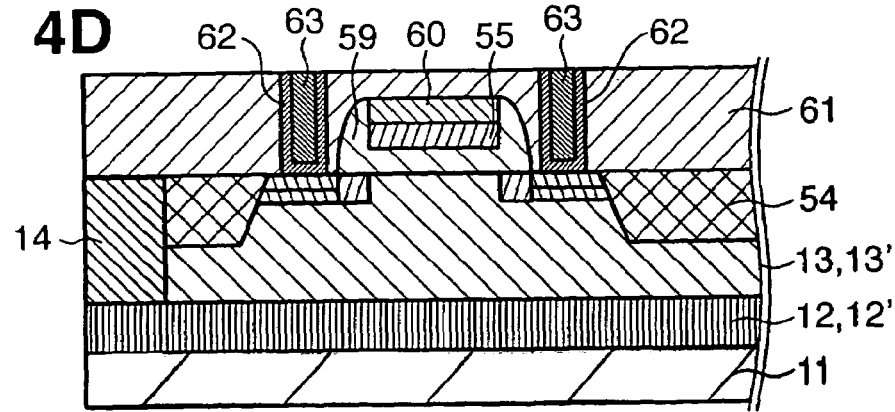

An insulating layer 61 is formed to cover the upper surface of the gate electrode and the upper surfaces of the source and drain regions, which are converted into a silicide (FIG. 4D). As the material of the insulating layer 61, silicon oxide containing phosphorus and/or boron is preferably used.

The surface is planarized by CMP (Chemical Mechanical Polishing) as needed. Then, contact holes are formed in the insulating layer 61. When photolithography using KrF excimer laser, ArF excimer laser, $F_2$ excimer laser, electron beam, or X-rays is applied, a rectangular contact hole having a side smaller than 0.25 μm or a circular contact hole having a diameter smaller than 0.25 μm can be formed.

The contact holes are filled with a conductive material. As a preferable method of filling the contact holes with a conductive material, a film of a high refractory metal or a nitride thereof, which serves as a barrier metal 62, is formed on the inner walls of the contact holes. Then, a conductive material 63 such as a tungsten alloy, aluminum, an aluminum alloy, copper, or a copper alloy is deposited by CVD, PVD (physical vapor deposition), or plating. A conductive material deposited higher than the upper surface of the insulating layer 61 may be removed by etch back or CMP. Before filling the contact holes with the conductive material, the surfaces of the silicide layers in the source and drain regions exposed to the bottom portions of the contact holes may be nitrided. With the above step, a transistor such as a FET (Field Effect Transistor) can be formed on the substrate, and a semiconductor device having the structure shown in FIG. 4D can be obtained.

As described above, according to this embodiment, the semiconductor layer can efficiently be strained, and the carrier mobility of the semiconductor layer can be increased. Hence, the device such as a transistor formed on the semiconductor layer can be driven at a high speed.

[Second Application Example of Semiconductor Substrate]

In this application example, the semiconductor device manufactured by the first application example of the semiconductor substrate is further improved. In this application example, as a gate electrode 55 formed on the surface of a semiconductor layer 13 or 13' by the first application example of the semiconductor substrate, a gate electrode which stretches the second semiconductor layer 13 or 13' in an almost horizontal direction is used, thereby further straining the semiconductor layer 13 or 13'. To do this, the gate electrode 55 which is ion-implanted and then annealed can be used.

In this case, as a strain inducing region 14, a material which applies a tensile force to the semiconductor layer 13 or 13' formed into an island shape is preferably used. However, such a material need not always be used. Various materials (i.e., the materials do not always apply a tensile force to the semiconductor layer 13 or 13') and structures optimized in accordance with the characteristic of element isolation can be used.

In addition, when an interlayer dielectric film is formed on the surface of the semiconductor layer 13 or 13', and stress due to this film is controlled, more stress can be applied to the semiconductor layer 13 or 13'.

Examples 1 to 5 of the present invention will be described below.

EXAMPLE 1

An 8-inch p-type silicon wafer 11 (resistivity: 0.013 to 0.017 Ω-cm) was prepared (FIG. 1A). Porous silicon 12 was formed on the surface of the silicon wafer 11 by anodizing (FIG. 1B). The anodizing solution was 50% HF:IPA=2:1 (volume ratio), the current density was 8 mA/cm$^2$, the current application time was 11 min, and the thickness of the porous silicon 12 was 10 μm. After the anodizing, the silicon wafer 11 was oxidized in oxygen at a low temperature of 400° C. for 1 hr. The surface oxide film was removed by DHF. Then, the wafer was loaded to an epitaxial apparatus. After being loaded to the epitaxial apparatus, the silicon wafer 11 was subjected to surface treatment in a hydrogen atmosphere at 950° C. for 10 sec to fill the surface pores. In addition, a small amount of silicon-based gas was introduced to fill the remaining surface pores. After that, silicon was epitaxially grown on the silicon wafer 11 to form an epitaxial silicon layer 13 having a predetermined thickness (FIG. 1C). The thickness of the epitaxial silicon layer 13 was determined in accordance with the device to be manufactured and could be controlled in a wide range of about 10 nm to several μm.

Next, a protective oxide film was formed on the surface of the epitaxial silicon layer 13. Patterning and etching were executed by lithography to pattern the epitaxial silicon layer 13 and the porous silicon 12 under it into an island shape (FIG. 1D). The size and shape of each island were determined in accordance with the device to be manufactured. The size of an island could be controlled to 1 to several hundred µm.

After the silicon was etched off, oxide films 14 were formed in the gaps between epitaxial silicon layers 13' and porous silicon 12' having an island shape by CVD using TEOS+$O_3$ as a raw material (FIG. 1E). The silicon oxide film can control its stress in a wide range. For this reason, conditions were set such that a tensile force was applied to the epitaxial silicon layers 13' and porous silicon 12' having an island shape.

With the above process, the silicon semiconductor layer 13' on the surface could be strained.

EXAMPLE 2

In Example 2, some steps in Example 1 were changed. More specifically, in Example 2, instead of forming a protective oxide film on the surface of an epitaxial silicon layer 13, and executing patterning and etching by lithography to pattern the epitaxial silicon layer 13 and porous silicon 12 under it, the epitaxial silicon layer 13 was patterned into island shapes (FIG. 2D).

EXAMPLE 3

In Example 3, some steps in Example 1 were changed. More specifically, in Example 3, porous silicon layers 12" were partially formed in a silicon wafer 11 (FIG. 3B). To selectively anodize silicon to partially form the porous silicon layers 12", for example, (1) boron is ion-implanted in a region where silicon is to be porosified to form a $p^{++}$-layer, or (2) an insulating protective film having an HF resistance is patterned on the silicon to cover the surface except the regions to be selectively porosified.

EXAMPLE 4

In Examples 1 to 3, a CMOS (Complementary Metal-Oxide Semiconductor) structure having an island shape was formed on the surface silicon (FIGS. 4A to 4D). The CMOS was formed by a general method. It was confirmed that the electron mobility and hole mobility in the NMOS and PMOS transistors increased as compared to a device with an unstrained structure.

EXAMPLE 5

A method of applying strain to a silicon semiconductor layer was applied to Example 4. More specifically, arsenic was injected to a gate electrode 55 immediately above the channel to form a gate protective film which surrounds the gate. After that, annealing was executed. By using expansion and contraction of the gate electrode 55 and gate protective film, local strain was generated in the channel region. In addition to the tensile force in the material which applied a tensile force between island-shaped silicon layers, stress was applied from immediately above the gate so that a semiconductor layer 13 or 13' could efficiently be strained. In addition, porous silicon 12 or 12' having a lower Young's modulus than that of the semiconductor layer 13 or 13' was arranged under it. With this structure, the silicon semiconductor layer 13 or 13' on the surface could further efficiently be strained.

In Examples 1 to 5 described above, the porous silicon formation conditions are not limited to the above conditions. To change the porosity, the type (p-type or n-type) of the substrate, resistivity, solution concentration, current, and temperature can be changed. As a method of epitaxially growing silicon on porous silicon, various methods such as CVD, MBE (Molecular Beam Epitaxy), sputtering, and liquid-phase growth can be employed. Other steps can also be executed not only under the conditions limited in the examples but also under various conditions.

As described above, according to the present invention, for example, a semiconductor layer can efficiently be strained.

(Fourth Embodiment)

Other preferred embodiments of the present invention will be described next with reference to the accompanying drawings. FIGS. 6A to 8H are sectional views taken along a line A–A' in FIG. 9B.

FIGS. 6A to 6H are sectional views for explaining a Fin device manufacturing method according to the preferred fourth embodiment of the present invention.

Figure 6A:
FIGS. 6A to 6H are sectional views for explaining a Fin device manufacturing method according to the preferred first embodiment of the present invention.

In the step shown in FIG. 6A, a substrate 21 is prepared. As the substrate 21, a substrate whose surface can be porosified is preferable. For example, silicon can be used.

Figure 6B:
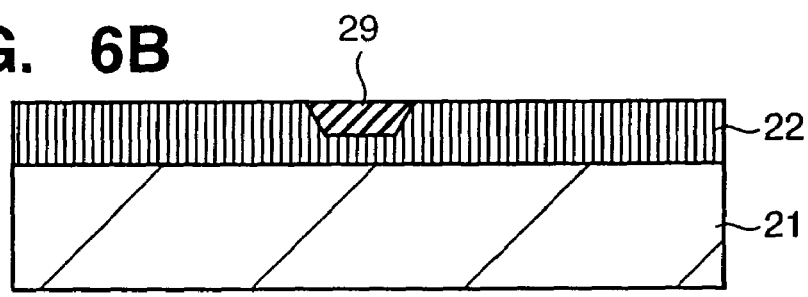
Figure 6C:
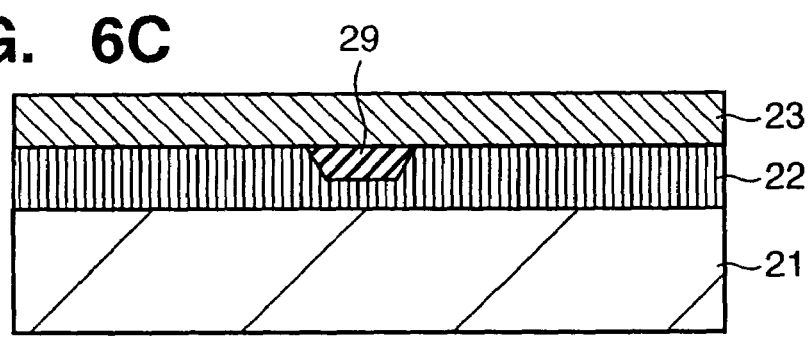

In the step shown in FIG. 6B, a porous layer 22 is formed on the surface of the substrate 21. For the porous layer 22, a material having a Young's modulus lower than that of a semiconductor layer 33 to be formed in the step shown in FIG. 6C is preferably used. For example, when a silicon substrate is used as the substrate 21, porous silicon formed by porosifying the surface of the silicon substrate can be used as the porous layer 22. Porous silicon can be formed by anodizing the surface of the silicon substrate. Anodizing can be executed by arranging an anode and a cathode in an electrolytic solution containing hydrofluoric acid, placing the substrate between the electrodes, and supplying a current between the electrodes.

As a characteristic of porous silicon, its Young's modulus can be changed to at least about 1 GPa to about 83 GPa by changing the porosity. Hence, when the porosity of the porous silicon is adjusted to set the Young's modulus of the porous silicon, the Young's modulus of the porous layer 22 can be set lower than that of the semiconductor layer 23 to be formed in the step shown in FIG. 6C.

The porous silicon layer may include a single layer having an almost uniform porosity or two or more layers having different porosities. In the present invention, the method of forming a porous layer is not limited to anodization, and may adopt a method of forming a porous layer by implanting an ion such as a hydrogen ion or helium ion in a substrate.

In the step shown in FIG. 6C, the semiconductor layer 23 is formed on the porous layer 22 formed in the step shown in FIG. 6B. The method of forming the semiconductor layer 23 is not particularly limited. The semiconductor layer 23 can be formed by, e.g., epitaxial growth. When epitaxial growth is used, a high-quality single-crystal semiconductor layer can be formed.

Figure 6D:
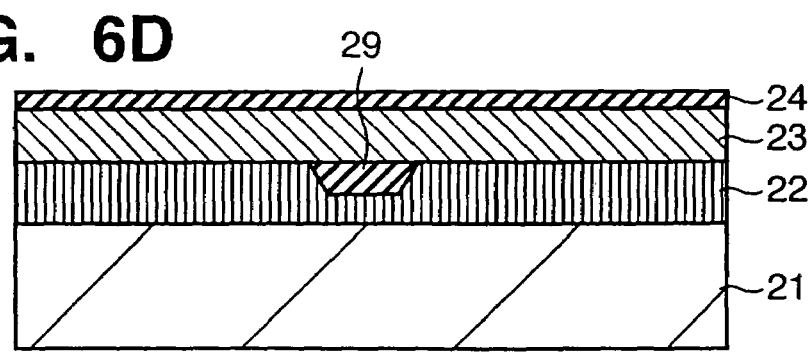

In the step shown in FIG. 6D, an insulating film 24 is formed on the semiconductor layer 23. The insulating film 24 includes, e.g., an oxide film, nitride film, LTO and other insulating film, and a multilayered structure of these films.

Figure 6E:
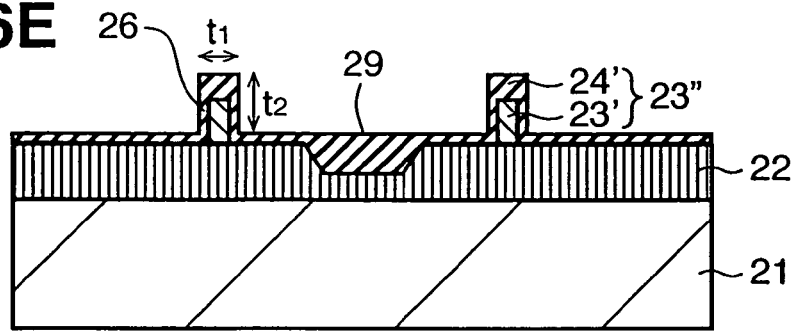

In the step shown in FIG. 6E, a resist is applied onto the insulating film 24 and patterned by lithography. Then, the insulating film 24 and semiconductor layer 23 are etched to form Fins 23" each of which has an insulating film 24' and semiconductor layer 23' and whose height of the section shape is larger than the width of the section shape. The Fin 23" is formed such that a width $t_1$ and height $t_2$ of the sectional shape satisfy $t_1<t_2$. That is, as a characteristic feature of the Fin 23", it has a vertically long sectional shape. A structure having the thus formed Fin is called a "Fin structure". A device having a Fin structure is called a "Fin device".

A gate insulating film 26 is formed on the surface of the Fin 23". As the material of the gate insulating film 26, for example, silicon oxide, silicon nitride, silicon oxynitride, aluminum oxide, tantalum oxide, hafnium oxide, titanium oxide, scandium oxide, yttrium oxide, gadolinium oxide, lanthanum oxide, zirconium oxide, or mixed glass thereof is preferably used. The gate insulating film 26 can be formed by, e.g., oxidizing the surface of the SOI layer or depositing an appropriate substance on the surface of the SOI layer by CVD or PVD.

Figure 6F:
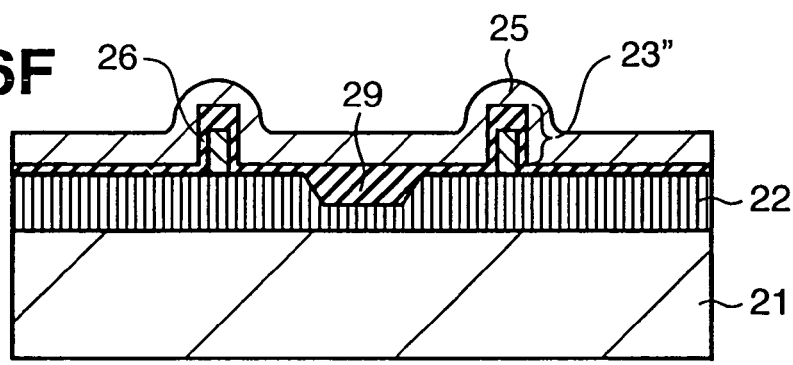

In the step shown in FIG. 6F, a gate electrode 25 is formed on the Fin 23". The gate electrode 25 can be formed from, e.g., polysilicon doped with a p- or n-type impurity, a metal such as tungsten, molybdenum, titanium, tantalum, aluminum, or copper, an alloy containing at least one of them, or a metal silicide such as molybdenum silicide, tungsten silicide, or cobalt silicide, or a metal nitride such as titanium nitride, tungsten nitride, or tantalum nitride. The gate insulating film 26 may be formed by stacking a plurality of layers made of different materials, like, e.g., a polycide gate. The gate electrode 55 may be formed by, e.g., a method called salicidation (self-aligned formation of silicide), a method called a damascene gate process, or any other method.

Figure 6G:
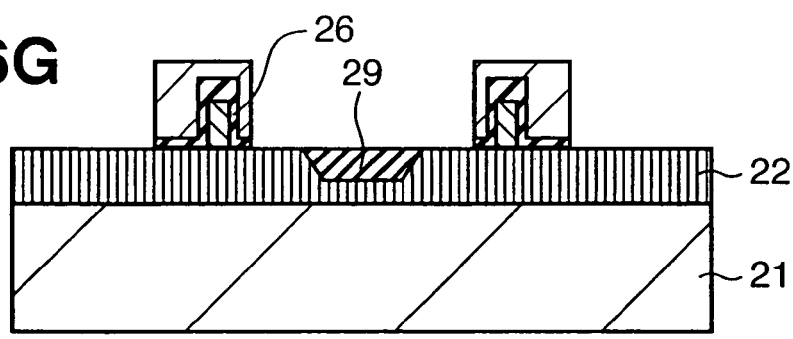

In the step shown in FIG. 6G, patterning is performed to form the gate electrode 25 and gate insulating film 26 at least on the side surfaces of the central portion of the Fin 23". The gate electrode 25 is formed on the gate insulating film 26 such that the Fin 23" is sandwiched by the gate electrode 25. Next, an n-type impurity such as phosphorus, arsenic, or antimony or a p-type impurity such as boron is doped into the Fin 23" exposed to both sides of the gate electrode 25 to form a relatively lightly doped source region 25' and drain region 25". The impurity can be doped by, e.g., ion implantation and annealing.

Figure 6H:
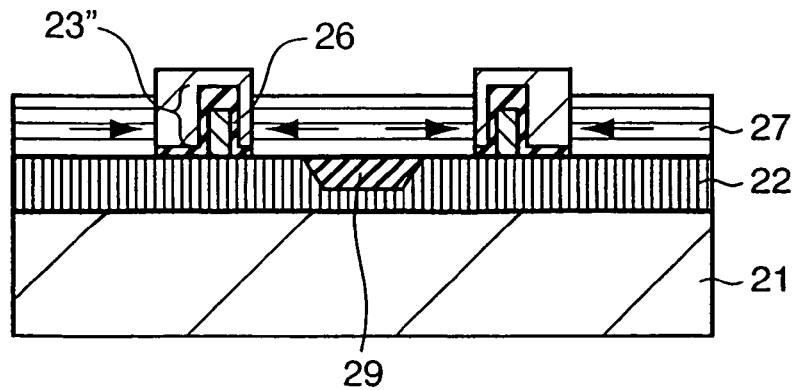

In the step shown in FIG. 6H, strain inducing regions 27 to apply stress to the Fin structure having the Fin 23" are formed in contact with the gate electrode 25 and Fin 23" in the source region 25' and drain region 25". As the strain inducing region 27, silicon oxide or SiN using, e.g., TEOS (Tetra Ethyl Ortho Silicate) as a raw material can be employed. Oxide silicon can be formed from TEOS, TEOS+ $O_2$, TEOS+$O_3$, $SiH_4+O_2$, $SiH_4+N_2O$, $SiH_2Cl_2+N_2O$, or the like by CVD (Chemical Vapor Deposition). As CVD, thermal CVD or plasma CVD can be used. Silicon nitride can be formed by using thermal CVD and plasma CVD. Examples of a raw material containing Si are $SiCl_2$, SiH, and $SiH_2Cl_2$. Examples of a raw material containing N are $NH_3$, $N_2H_4$, and $N_2$.

The strain inducing region 27 spreads almost parallel to the surface of the porous layer 22 to apply compression stress to the Fin structure having the Fin 23". The Fin 23" has such a structure that the width $t_1$ and the height $t_2$ of the sectional shape satisfy $t_1<t_2$. For this reason, stress from the side surface is converted into in-plane strain. Hence, larger strain can be generated in the Fin 23" by smaller stress from the strain inducing region 27. When strain is generated in the strain inducing region 27, the mobility of carriers which moves in the Fin 23" increases.

The porous layer 22' having a lower Young's modulus than that of the Fin 23" is formed on the lower side. For this reason, most of the compression stress applied from the strain inducing region 27 to the Fin 23" acts on the Fin 23" so that the stress from the strain inducing region 27 can be smaller. As described above, when the porous layer 22' is arranged under the Fin 23" to efficiently convert the compression stress into in-plane strain, large strain can be generated by smaller stress.

A Fin device is manufactured by the above method.

Figure 9A:
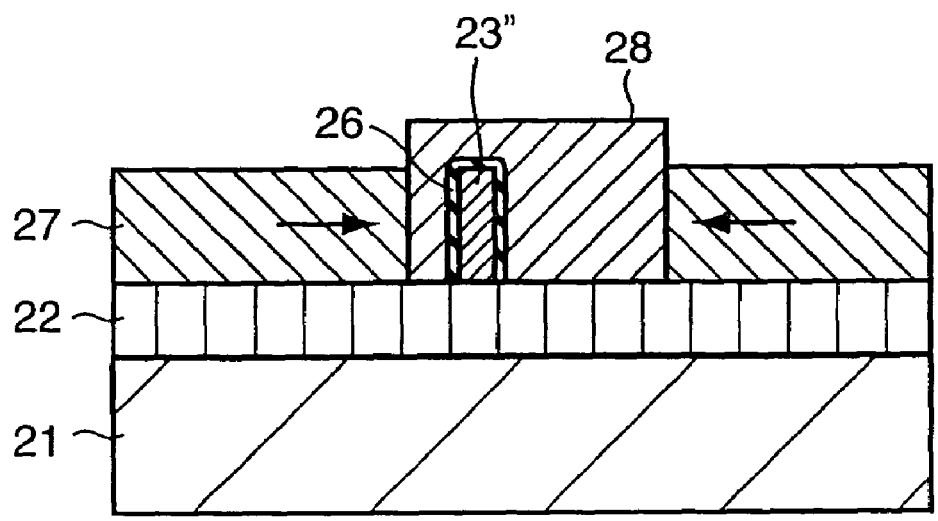
FIGS. 9A and 9B are views for explaining the structure of the Fin device.
Figure 9B:
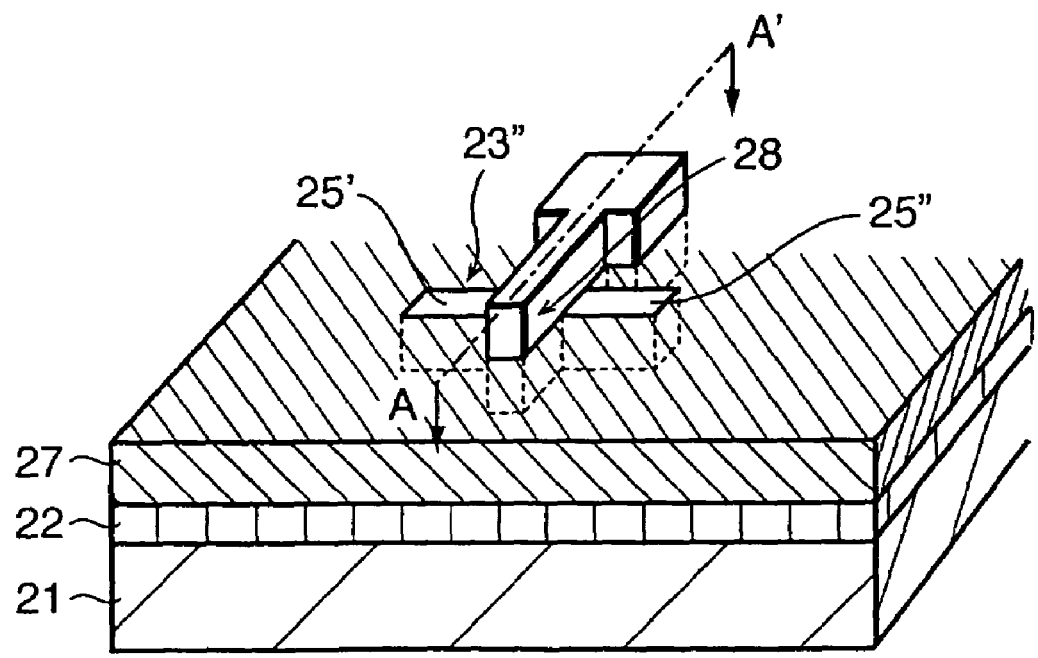

FIGS. 9A and 9B are schematic views showing the structure of the Fin device manufactured by the above Fin device manufacturing method. FIG. 9A is a sectional view taken along a line A–A' in FIG. 9B. FIG. 9B is a perspective view of the Fin device. As shown in FIGS. 9A and 9B, according to this embodiment, a Fin FET having the porous layer 22 formed on the substrate 21, and the strain inducing region 27 which applies stress to the Fin 23" formed on the porous layer 22 is manufactured.

A plurality of Fins 23" may be formed on the porous layer 22. For example, FIG. 6E illustrates two identical structures. Increasing the number of structures corresponds to increasing W (width) of the channel of the transistor having a Fin structure. In this case, for example, an element isolation region 29 such as an insulating film or shallow trench is preferably formed on the porous layer 22 in the step shown in FIG. 6B by using an element isolation method such as LOCOS or STI. In the step shown in FIG. 6D, the insulating film 24 is formed on the semiconductor layer 23. The insulating film 24 may be omitted. In this case, the gate insulating film 26 is formed on the upper surface of the Fin 23" in the step shown in FIG. 6E.

(Fifth Embodiment)

A Fin device manufacturing method according to the preferred fifth embodiment of the present invention will be described below. In the Fin device manufacturing method according to this embodiment, some steps in the Fin device manufacturing method according to the fourth embodiment are changed. FIGS. 7A to 7H are sectional views showing the Fin device manufacturing method according to the fifth embodiment. A description of, in the steps shown in FIGS. 7A to 7H, the same steps as in FIGS. 6A to 6H will be omitted.

Figure 7A:
FIGS. 7A to 7H are sectional views for explaining a Fin device manufacturing method according to the preferred second embodiment of the present invention.
Figure 7B:
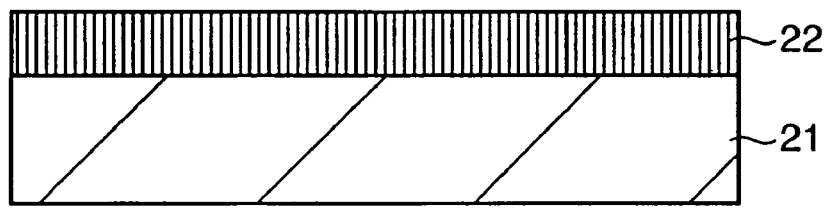
Figure 7C:
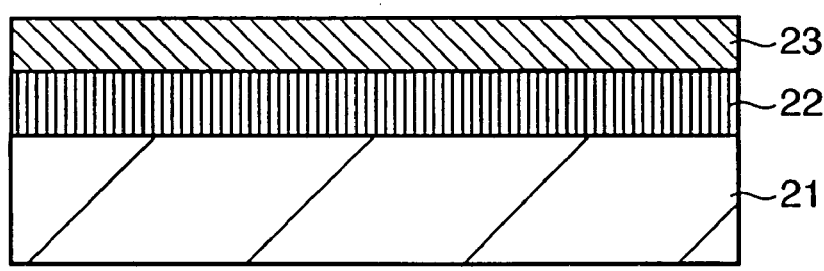
Figure 7D:
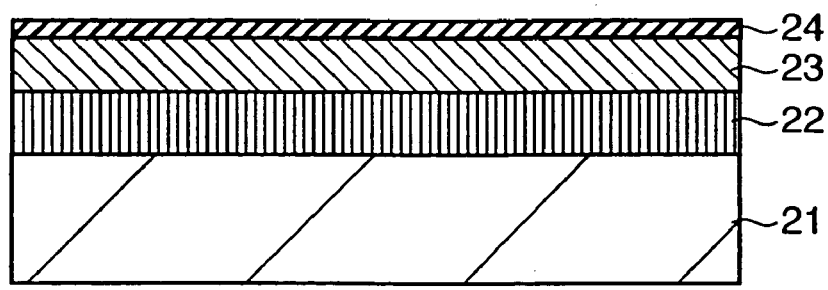
Figure 7E:
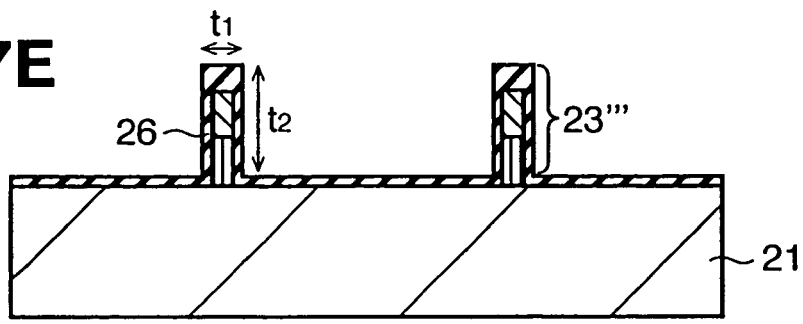
Figure 7F:
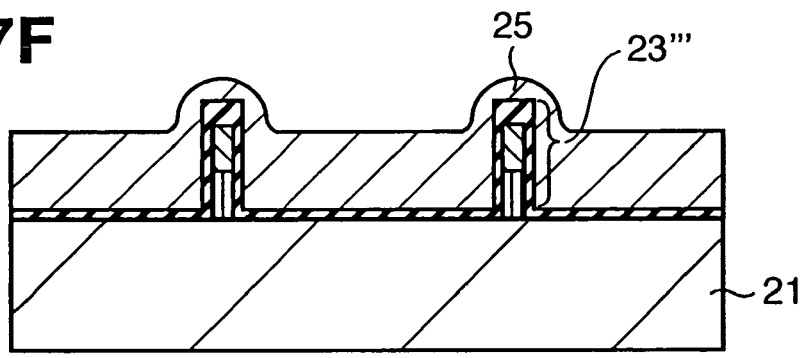
Figure 7G:
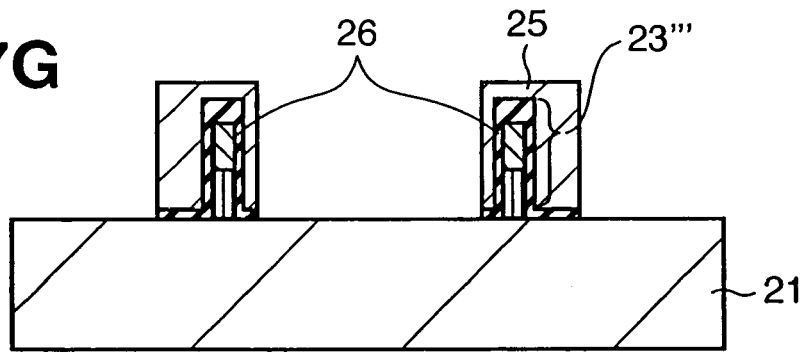

In the step shown in FIG. 7E (corresponding to FIG. 6E), a resist is applied onto an insulating film 24 and patterned by lithography. Then, the insulating film 24, semiconductor layer 23, and porous layer 22 are etched. The patterned semiconductor layer 23 and porous layer 22 form a Fin 23'" having a semiconductor region whose height of the sectional shape is larger than the width of the sectional shape. The Fin 23'" is formed such that a width $t_1$ and height $t_2$ of the sectional shape satisfy $t_1<t_2$.

Figure 7H:
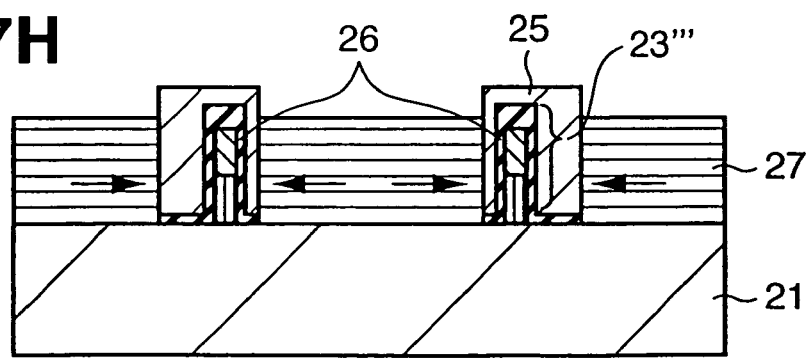

In the step shown in FIG. 7H (corresponding to FIG. 6H), strain inducing regions 27 which apply stress onto a substrate 21 are formed. As the strain inducing region 27, silicon oxide or SiN using, e.g., TEOS (Tetra Ethyl Ortho Silicate) as a raw material can be employed.

(Sixth Embodiment)

A Fin device manufacturing method according to the preferred sixth embodiment of the present invention will be described below. In the Fin device manufacturing method according to this embodiment, some steps in the Fin device manufacturing method according to the fourth embodiment are changed. FIGS. 8A to 8H are sectional views showing the Fin device manufacturing method according to the sixth embodiment. A description of, in the steps shown in FIGS. 8A to 8H, the same steps as in FIGS. 6A to 6H will be omitted.

Figure 8A:
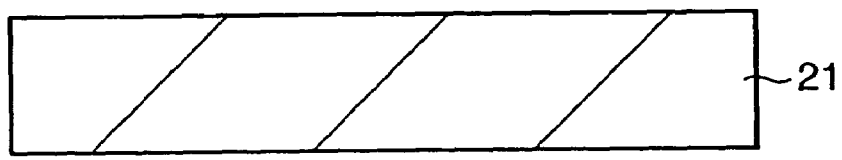
FIGS. 8A to 8H are sectional views for explaining a Fin device manufacturing method according to the preferred third embodiment of the present invention.
Figure 8B:
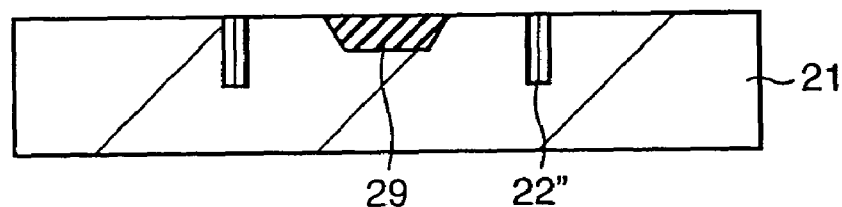
Figure 8C:
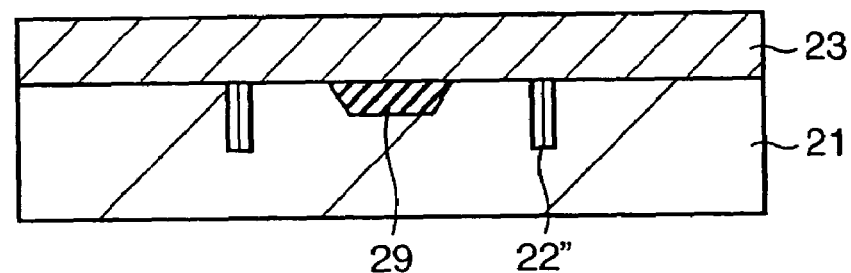
Figure 8D:
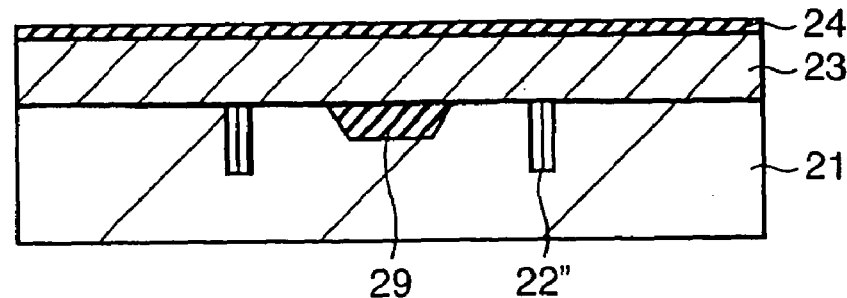

In the step shown in FIG. 8B (corresponding to FIG. 6B), porous layers 22" are partially formed in a substrate 21. When anodizing is employed as a method of partially forming the porous layers 22", for example, a protective film (e.g., a nitride film or HF-resistant mask) which protects the substrate from the chemical solution (e.g., hydrofluoric acid) used in anodizing is formed on the substrate 21. After that, the substrate 21 is anodized to form the partial porous layers 22' shown in FIG. 8B.

Figure 8E:
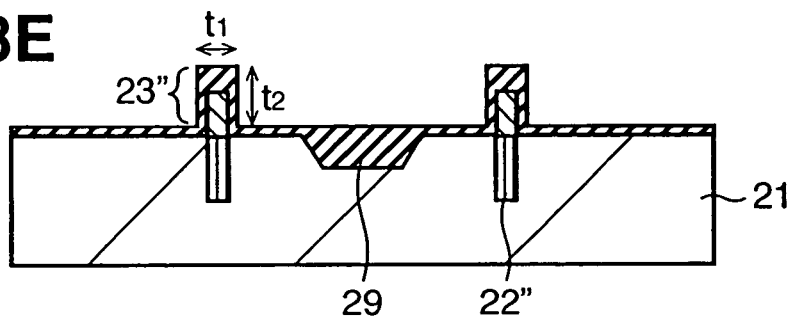
Figure 8F:
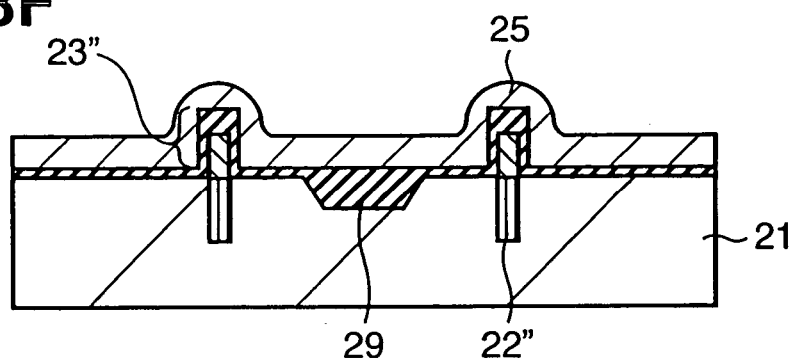
Figure 8G:
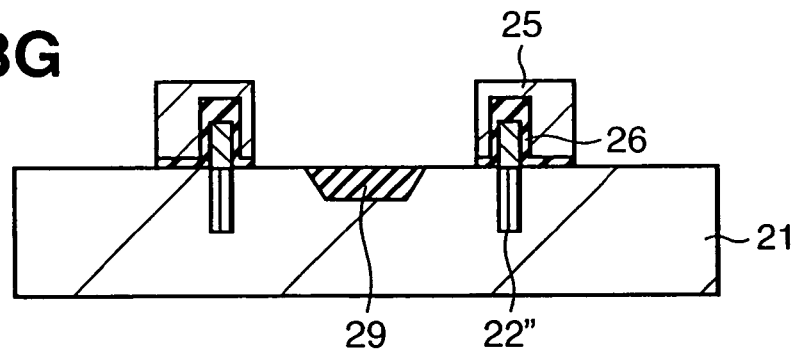
Figure 8H:
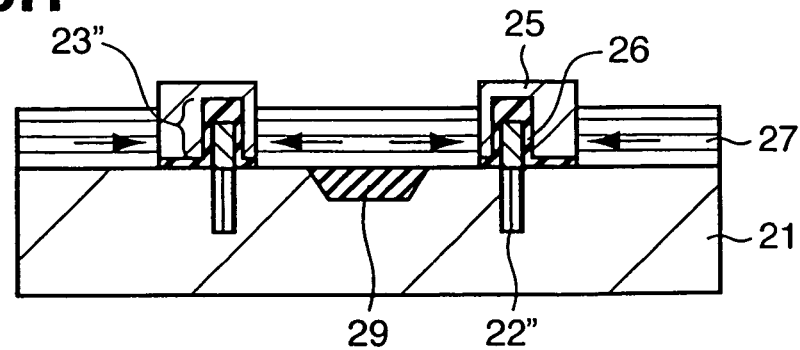

In the step shown in FIG. 8E (corresponding to FIG. 6E), an insulating film 24 and semiconductor layer 23 are etched as in the fourth embodiment. The sixth embodiment is different from the fourth embodiment in that a Fin 23''' having a semiconductor region whose height of the sectional shape is larger than the width of the sectional shape is formed on the partial porous layer 22" formed in the step shown in FIG. 8B. The Fin 23''' is formed such that a width $t_1$ and height $t_2$ of the sectional shape satisfy $t_1 < t_2$.

A plurality of Fins 23''' may be formed on the substrate 21. In this case, for example, an element isolation region 29 such as an insulating film or shallow trench is formed on the substrate 21 in the step shown in FIG. 8B by using an element isolation method such as LOCOS or STI.

As described above, according to the present invention, for example, a semiconductor region can efficiently be strained.

Examples 6 to 8 of the present invention will be described below.

EXAMPLE 6

An 8-inch p-type silicon wafer 21 (resistivity: 0.013 to 0.017 Ω-cm) was prepared (FIG. 6A). Porous silicon 22 was formed on the surface of the substrate 21 by anodizing (FIG. 6B). The anodizing solution was 50% HF:IPA=2:1 (volume ratio), the current density was 8 mA/cm$^2$, the current application time was 11 min, and the thickness of the porous silicon 12 was 10μm. After anodizing, the silicon wafer 21 was oxidized in oxygen at a low temperature of 400° C. for 1 hr. The surface oxide film was removed by DHF. Then, the wafer was loaded to an epitaxial apparatus. After loading to the epitaxial apparatus, the silicon wafer 21 was subjected to surface treatment in a hydrogen atmosphere at 950° C. for 10 sec to fill the surface pores. In addition, a small amount of silicon-based gas was introduced to fill the remaining surface pores. After that, silicon was epitaxially grown on the silicon wafer 21 to form an epitaxial silicon layer 23 having a predetermined thickness (FIG. 6C). The thickness of the epitaxial silicon layer 23 was determined in accordance with the device to be manufactured and could be controlled in a wide range of about 10 nm to several μm.

Next, an insulating film 24 was formed on the surface of the epitaxial silicon layer 23 (FIG. 6D). Patterning and etching were executed by lithography to etch the insulating film 24 and epitaxial silicon layer 23 under it into a Fin structure. After that, a gate insulating film 26 is formed on the surface of a Fin 23" (FIG. 6E).

A gate electrode 25 was formed on the Fin 23" (FIG. 6F).

The gate electrode 25 and gate insulating film 26 were patterned to form the gate electrode 25 on the gate insulating film 26 at the central portion of the Fin 23" such that the Fin 23" was sandwiched by the gate electrode 25. Next, an n-type impurity such as phosphorus, arsenic, or antimony or a p-type impurity such as boron was doped into the Fin 23" exposed to both sides of the gate electrode 25 to form a relatively lightly doped source region 25' and drain region 25" (FIG. 6G).

Next, strain inducing regions 27 to apply stress to the Fin structure having the Fin 23" were formed in contact with the gate electrode 25 and Fin 23" in the source region 25' and drain region 25" (FIG. 6H). The strain inducing region 27 were formed in the gaps between the epitaxial silicon layer 23' and porous silicon 22' having a Fin shape by CVD using TEOS+O$_3$ as a raw material. The silicon oxide film can control its stress in a wide range. For this reason, conditions were set such that a tensile force was applied to the sidewalls of the epitaxial silicon layer 23" having a Fin shape. With the above process, the Fin 23" could be strained. A Fin device was thus manufactured.

EXAMPLE 7

In Example 7, some steps in Example 6 were changed. More specifically, in Example 7, instead of forming a protective oxide film on the surface of an epitaxial silicon layer 23, and executing patterning and etching by lithography to pattern an insulating film 24 and epitaxial silicon layer 23, the insulating film 24, epitaxial silicon layer 23, and porous layer 22 were etched into a Fin structure (FIG. 7E).

EXAMPLE 8

In Example 8, some steps in Example 6 were changed. More specifically, in Example 8, porous silicon layers 22" were partially formed in a silicon wafer 21 (FIG. 8B). To selectively anodize silicon to partially form the porous silicon layers 22", for example, (1) boron is ion-implanted in a region where silicon is to be porosified to form a p$^+$-layer, or (2) an insulating protective film having an HF resistance is patterned on the silicon to cover the surface except the regions to be selectively porosified. Unlike Example 1, a Fin 23''' having a semiconductor region whose height of the sectional shape is larger than the width of the sectional shape was formed (FIG. 8E). The Fin 23''' was formed such that a width $t_1$ and height $t_2$ of the sectional shape satisfied $t_1 < t_2$. It was confirmed that the carrier mobility in the FIN transistor formed in Examples 6 to 8 according to the present invention increased as compared to a device with an unstrained structure.

In Examples 6 to 8 described above, the porous silicon formation conditions are not limited to the above conditions. To change the porosity, the type (p-type or n-type) of the substrate, resistivity, solution concentration, current, and temperature can be changed. As a method of epitaxially growing silicon on porous silicon, various methods such as CVD, MBE (Molecular Beam Epitaxy), sputtering, and liquid-phase growth can be employed. Other steps can also be executed not only under the conditions limited in the examples but also under various conditions.

As many apparently widely different embodiments of the present invention can be made without departing from the spirit and scope thereof, it is to be understood that the invention is not limited to the specific embodiments thereof except as defined in the claims.

What is claimed is:

1. A semiconductor substrate comprising:
    a semiconductor layer;
    a porous layer which supports said semiconductor layer; and a strain inducing region which strains said semiconductor layer by applying stress to said semiconductor layer, wherein said semiconductor layer includes a plurality of island-shaped semiconductor regions, and said strain inducing region is formed between said plurality of island-shaped semiconductor regions.

2. The substrate according to claim 1, wherein said porous layer is a porous silicon layer.

3. The substrate according to claim 1, wherein said semiconductor layer is essentially made of single-crystal silicon.

4. The substrate according to claim 1, wherein said strain inducing region is essentially made of silicon oxide.

5. The substrate according to claim 1, wherein said strain inducing region is essentially made of silicon nitride.

6. The substrate according to claim 1, wherein a semiconductor device is formed on said semiconductor layer.

7. The substrate according to claim 6, further comprising a second strain inducing region which is formed above a channel of the semiconductor device and strains said semiconductor layer by applying stress to said semiconductor layer.

8. A semiconductor substrate manufacturing method comprising steps of:

forming a porous layer on a substrate;

forming a semiconductor layer on the porous layer; and forming a strain inducing region which strains said semiconductor layer by applying stress to said semiconductor layer, wherein the method further comprises, after the step of forming said semiconductor layer, a step of forming an opening portion by partially etching said semiconductor layer, and wherein in the step of forming said strain inducing region, said strain inducing region is formed in said opening portion.

9. A semiconductor device comprising:

a porous layer;

a structure which is formed on said porous layer and has a semiconductor region, wherein the height of said semiconductor region is larger than the width of said semiconductor region; and a strain inducing region which strains said structure by applying stress to said structure.

10. A transistor comprising:

a semiconductor device of claim 9;

a source which is formed at one end of said semiconductor region; and a drain which is formed at the other end of said semiconductor region.

11. A semiconductor device manufacturing method comprising steps of:

forming a porous layer on a substrate;

forming a semiconductor layer on the porous layer;

etching the semiconductor layer to form a semiconductor region, wherein the height of said semiconductor region is larger than the width of said semiconductor region; and forming a strain inducing region which strains said semiconductor region by applying stress to said semiconductor region.

* * * * *

UNITED STATES PATENT AND TRADEMARK OFFICE
CERTIFICATE OF CORRECTION

PATENT NO. : 7,164,183 B2
APPLICATION NO. : 10/857881
DATED : January 16, 2007
INVENTOR(S) : Kiyofumi Sakaguchi et al.

It is certified that error appears in the above-identified patent and that said Letters Patent is hereby corrected as shown below:

COLUMN 1
Line 40, "b.ht ml" should read --b.html--.

COLUMN 7
Line 46, "suicide" should read --silicide--.

COLUMN 10
Line 45, "the-porous" should read --the porous--.

Signed and Sealed this

Twenty-sixth Day of June, 2007

JON W. DUDAS
*Director of the United States Patent and Trademark Office*